(12) United States Patent
Kurd et al.

(10) Patent No.: US 6,320,424 B1
(45) Date of Patent: Nov. 20, 2001

(54) METHOD OF PROVIDING AND CIRCUIT FOR PROVIDING PHASE LOCK LOOP FREQUENCY OVERSHOOT CONTROL

(75) Inventors: Nasser A. Kurd, Hillsboro; Yi Lu; Keng Wong, both of Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/609,331

(22) Filed: Jun. 30, 2000

(51) Int. Cl.[7] ............................................... G01R 25/00
(52) U.S. Cl. ............................ 327/8; 327/157; 327/49
(58) Field of Search ............................ 327/156, 157, 327/245, 7, 3, 5, 8, 12, 41, 42, 47, 49

(56) References Cited

U.S. PATENT DOCUMENTS

| | | | |
|---|---|---|---|
| 5,592,113 | * | 1/1997 | Quiet et al. .......................... 327/158 |
| 5,815,041 | * | 9/1998 | Lee et al. .............................. 331/8 |
| 5,825,210 | * | 10/1998 | Oh ....................................... 327/12 |
| 5,909,130 | * | 6/1999 | Martin et al. ......................... 327/12 |

* cited by examiner

Primary Examiner—Toan Tran
Assistant Examiner—Cassandra Cox
(74) Attorney, Agent, or Firm—Antonelli, Terry, Stout & Kraus, LLP

(57) ABSTRACT

A phase lock loop system is provided that includes a phase frequency detector device to receive a reference clock signal and a feedback clock signal and to provide a first control signal and a second control signal. The phase lock loop system may include a width control circuit to alter a width of the first control signal and to produce an altered first control signal.

33 Claims, 7 Drawing Sheets

METHOD OF PROVIDING AND CIRCUIT FOR PROVIDING PHASE LOCK LOOP FREQUENCY OVERSHOOT CONTROL

FIELD

This invention relates to phase-lock loop circuits and more particularly relates to a phase frequency detector of a phase-lock loop circuit.

BACKGROUND

Phase-lock loops (PLL) include a phase-frequency detector (PFD) that provides control signals indicative of a phase difference between a reference clock signal and a feedback clock signal such as a VCO clock of a voltage controlled oscillator (VCO). A charge pump converts a digital output of the PFD to an analog current (or signal) which is then integrated by a loop filter to generate a control voltage. The VCO provides an oscillation signal responsive to the voltage signal. However, prior to the reference clock signal becoming stabilized with the feedback clock signal, a phase-lock loop transient overshoot may exceed a clock tree bandwidth. In such a circumstance, the phase-frequency detector may not receive any feedback clock signal and thus synchronization may not occur. The phase-lock loop may not be able to recover from this condition. Another problem with transient overshoot is the power management while the phase-lock loop is acquiring the lock between the reference clock signal and the feedback clock signal. If the phase-lock loop produces a very high frequency upon starting up, then a large current may cause the power to collapse in such a way that the circuit may not be able to recover. Accordingly, it is desirable to prevent the phase-lock loop from generating a transient overshoot of its frequency while acquiring synchronization between the reference clock signal and the feedback clock signal.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings wherein like reference numerals represent like elements and wherein.

DETAILED DESCRIPTION

Figure 1:
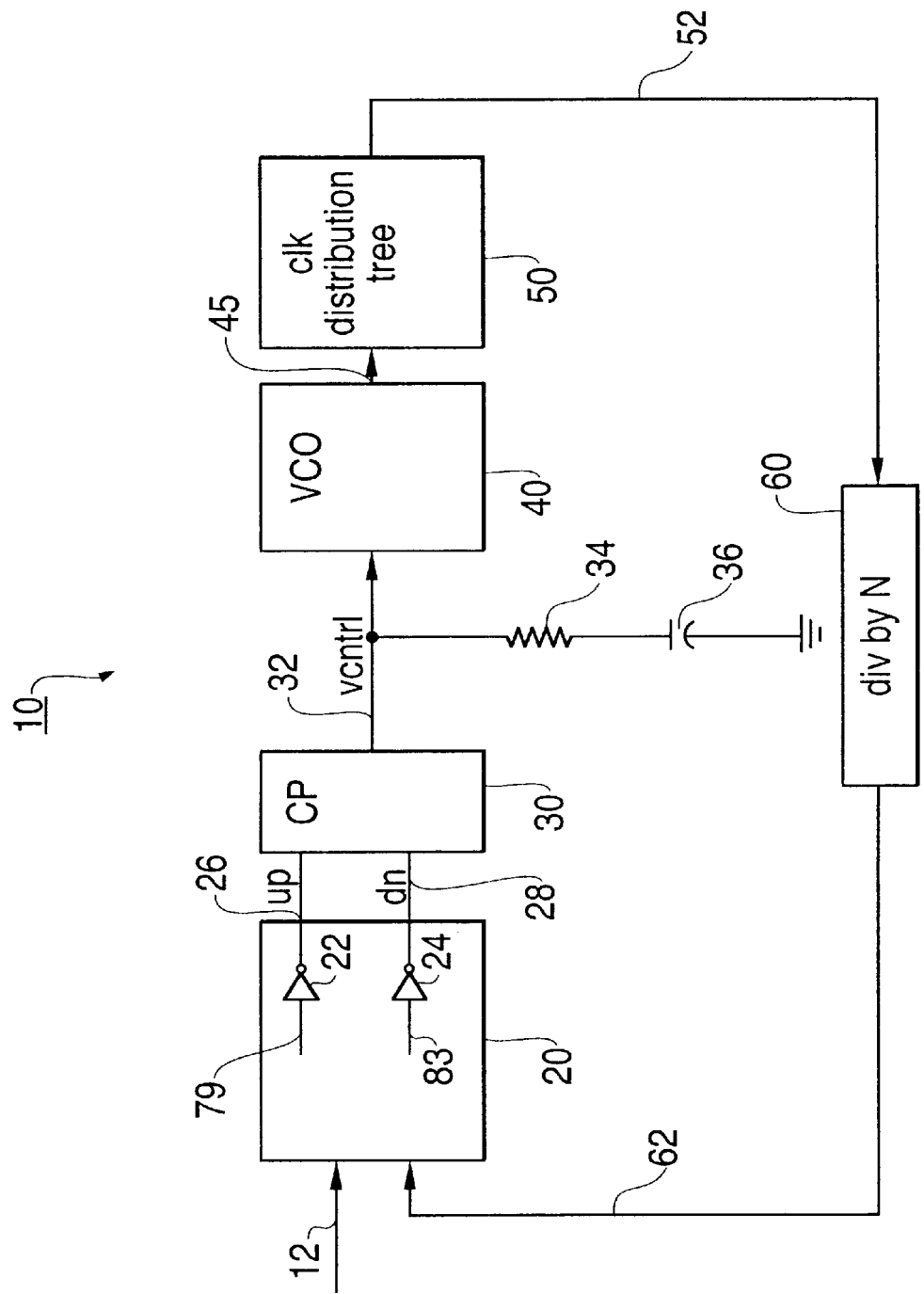
FIG. 1 shows an example clocking system.

Before beginning a detailed description of the present invention, mention of the following is in order. When appropriate, like reference numerals and characters may be used to designate identical, corresponding or similar components in different figure drawings. While the present invention will be described with respect to example circuits, the implementation of these circuits may be accomplished in any one of several ways, including but not limited to logic circuits, circuit elements provided within a microchip or integrated circuit as well as software implementation of the respective functions. Each of these implementations is within the scope of the present invention. The circuit design (s) may be further provided on any number of machine readable media including but not limited to magnetic disks (fixed, floppy, and removable); other magnetic media such as magnetic tapes; optical media such as CD-ROM disks; via Internet downloads or any other viable method. Further, the circuit designs may have many variations of the circuit components that can perform the various functions. Each of these variations are within the scope of the present invention. Embodiments of the present invention may also be described with respect to signals being input or output from different circuit components. It is understood that while the discussion identifies a signal, the signal may be transmitted over a signal line such as that shown in the drawings. Further, the terminology signal may also correspond to a signal line as shown in the drawings. Additionally, well known power/ground and address connections to components may not be shown within the Figures for simplicity of illustration and discussion, and so as not to obscure the invention. A discussion of the example circuits and example timing diagrams will now follow.

FIG. 1 shows a clocking system 10 that includes a phase frequency detector (PFD) 20, a charge pump (CP) 30, a voltage controlled oscillator (VCO) 40, a clock distribution tree 50 and a divide-by-N counter 60. A reference clock signal 12 is applied to an input of the phase frequency detector 10. The reference clock signal 12 may be provided by an external clocking source. That is, the clocking source may be external to a microchip or integrated circuit containing the clocking system 10. A feedback clock signal 62 may also be applied to an input of the phase frequency detector 20. The phase frequency detector 20 generates a signal 79 and a signal 83 based on the reference clock signal 12 and the feedback clock signal 62. The signal 79 is applied to an input of an inverter circuit 22 that provides an up signal 26. The signal 83 is applied to an input of an inverter circuit 24 that provides a down signal 28. The up signal 26 and the down signal 28 are applied to input terminals of t charge pump 30. That is, the phase frequency detector 20 compares the phase of the reference clock signal 12 and the feedback clock signal 62 and provides the up signal 26 and the down signal 28 to input terminals of the charge pump 30. The up and down signals 26, 28 indicate respective positive and negative charge directions for the charge pump 30. The charge pump 30 converts the digital inputs (i.e., produces a voltage control signal 32 based on the up and down signals 26 and 28) to an analog current (or signal) which is then integrated by a loop filter to generate a control voltage signal 32. The voltage control signal 32 is applied to the VCO 40 for varying the frequency of the VCO clock signal 45 that is input to the clock distribution tree 50.

The clock distribution tree 50 produces a signal 52 that is applied to the divide-by-N counter 60 that in turn produces the feedback clock signal 62. The signal 52 produced by the clock distribution tree 50 also becomes the clock signal that will input to the state machines on the microchip or integrated circuit. As discussed above, the feedback clock signal 62 is applied to an input of the phase frequency detector 20.

A filter, such as a second order filter, may also be provided between the charge pump 30 and the voltage controlled oscillator 40. The second order filter may include a resistor 34 and a capacitor 36 coupled to ground. Other types of filters may also be used. The up signal 26 and the down signal 28 charge or discharge the capacitor 36. This, in turn, decreases or increases the voltage of the voltage control signal 32 applied to the VCO 40. The VCO 40 determines the frequency output of the VCO clock signal 45. Stated differently, the up signal 26 and the down signal 28 are used to determine the frequency output of the VCO 40.

The phase frequency detector 20 generates the phase difference between the up signal 26 and the down signal 28 to be substantially equal to the phase difference between the reference clock signal 12 and the feedback clock signal 62. In particular, the phase difference of the reference clock signal 12 and the feedback signal 62 is copied and realized by the difference in the duration of the up and down signal 26 and 28. When the feedback clock signal 62 is slower than the reference clock signal 12 (i.e., the feedback clock signal is lagging), then the duration of the up signal 26 may be larger than the duration of the down signal 28. This increase the frequency of the VCO clock signal 45. On the other hand, when the VCO clock signal 45 is faster than the reference clock signal 12 (i.e., the feedback clock signal is leading), then the duration of the down signal 28 may be larger than the duration of the up signal 26. This decreases the frequency of the VCO clock signal 45.

In such a clocking system as shown in FIG. 1, prior to the reference clock signal 12 becoming synchronous with the feedback clock signal 62 (i.e., the phase lock loop acquiring lock), a transient overshoot may exceed a bandwidth of the clock distribution tree 50. The phase frequency detector 20 may not receive the feedback clock signal 62 when this occurs. As a result, the VCO 40 may increase the frequency of the VCO clock signal 45 even further such that synchronization may not occur. Even further, a very high frequency prior to synchronization may result in a large current causing the power to collapse in which the integrated circuit may not be able to recover. Thus, it is desirable to prevent the phase-lock loop from generating a large transient overshoot.

Figure 2:
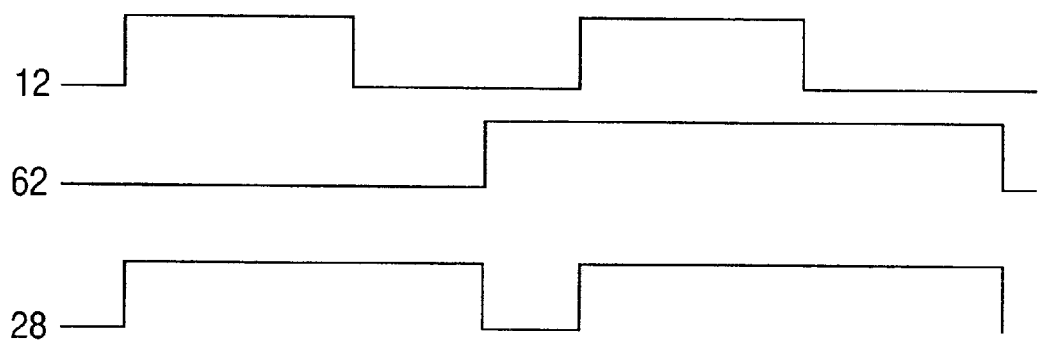
FIG. 2 is a timing diagram of signals shown in FIG. 1.

FIG. 2 shows a timing diagram of three signals shown in FIG. 1. In this example, the down signal 28 may be produced (i.e., go high) upon a leading edge of the reference clock signal 12. The down signal 28 may remain high until a leading edge of the feedback clock signal 62. The down signal 28 may again go high at the next leading edge of the reference clock signal 12. The transient overshoot may cause a large increase in the frequency of the VCO clock signal 45 as discussed above.

Figure 3:
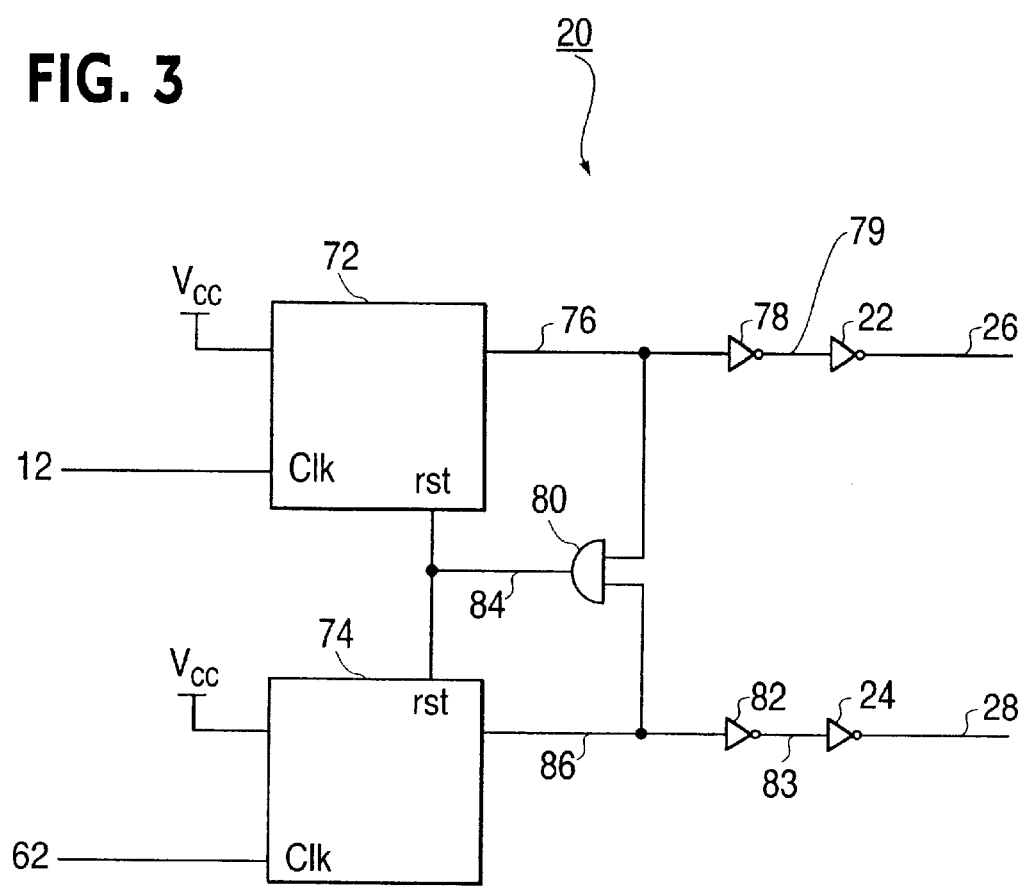
FIG. 3 shows the phase-frequency detector from FIG. 1.

FIG. 3 shows components of the phase frequency detector 20 shown in FIG. 1. The phase frequency detector 20 may include a first flip flop circuit 72 and a second flip flop circuit 74. Each of the flip flop circuits 72 and 74 may be a D-type of flip flop circuit in which the D inputs are connected to a high voltage ($V_{cc}$). The reference clock signal 12 may be applied to a clock input of the first flip flop circuit 72 and the feedback clock signal 62 may be applied to a clock input of the second flip flop circuit 74. The first flip flop circuit 72 produces a signal 76 that is applied to an input of an inverter circuit 79. The inverter circuit 78 produces the signal 79 that is applied to an input of the inverter circuit 22 that in turn produces the up signal 26. The signal 76 is also applied to a first input of a NAND gate 80.

The second flip flop circuit 74 produces a signal 86 that is applied to an input of an inverter circuit 82. The inverter circuit 82 produces the signal 83 that is applied to an input of the inverter circuit 24 that in turn produces the down signal 28. The signal 86 is also applied to a second input of the NAND gate 80.

The NAND gate 80 performs a logical NAND operation on the signal 76 and the signal 86 to produce a reset signal 84. The reset signal 84 is applied to a reset input of both the first flip flop circuit 72 and the second flip flop circuit 74.

Figure 4:
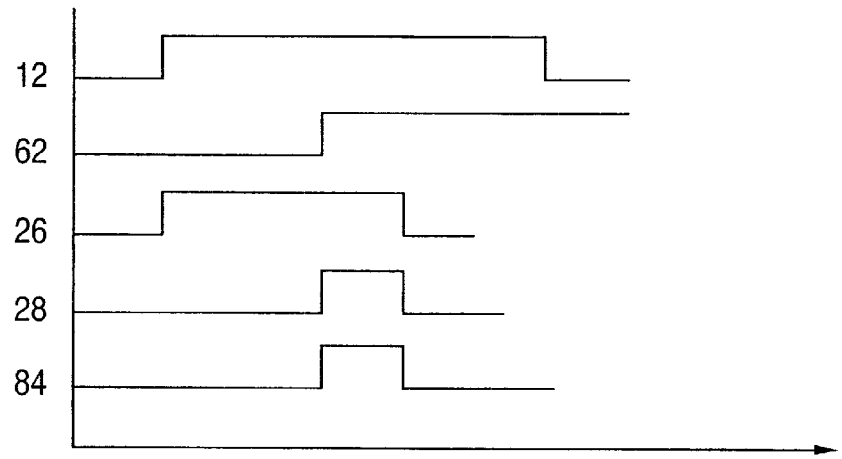
FIG. 4 is a timing diagram of signals shown in FIG. 3.

FIG. 4 shows a timing diagram of signals shown in FIG. 3. In this Figure, the reference clock signal 12 is shown as leading the feedback clock signal 62. Accordingly, the up signal 26 may go high at the leading edge of the reference clock signal 12 and remain high until the feedback clock signal 62 is detected. The down signal 28 may be produced (i.e. go high) upon the leading edge of the feedback clock signal 62. FIG. 4 also shows the reset signal 84 that is produced when both the up signal 26 and the down signal 28 are high. However, as discussed above, the timing of the signals shown in FIG. 4 may cause a transient overshoot to occur.

In this example, the width of the up signal 26 and the down signal 28 is based on the phase or frequency difference between the reference clock signal 12 and the feedback clock signal 62. A large width of the up signal 26 and the down signal 28 may cause a large change in the loop filter voltage that translates into a large change in the frequency. Thus, upon starting the synchronization process, a large width of the signal is expected. If the transient overshoot frequency is greater than the clock tree bandwidth or if the power consumed is greater than the power delivered, then the entire power and clock network may not function properly.

Embodiments of the present invention may avoid these problems by providing width control of the phase frequency detector outputs (i.e. the up/down control signals). That is, embodiments of the present invention provide a phase lock loop system that includes a phase frequency detector device to receive a reference clock signal and a feedback clock signal and to provide a first control signal and a second control signal. A width control circuit may alter a width of the first control signal and alter a width of the second control signal. The width control circuit may include delay circuits.

Figure 5:
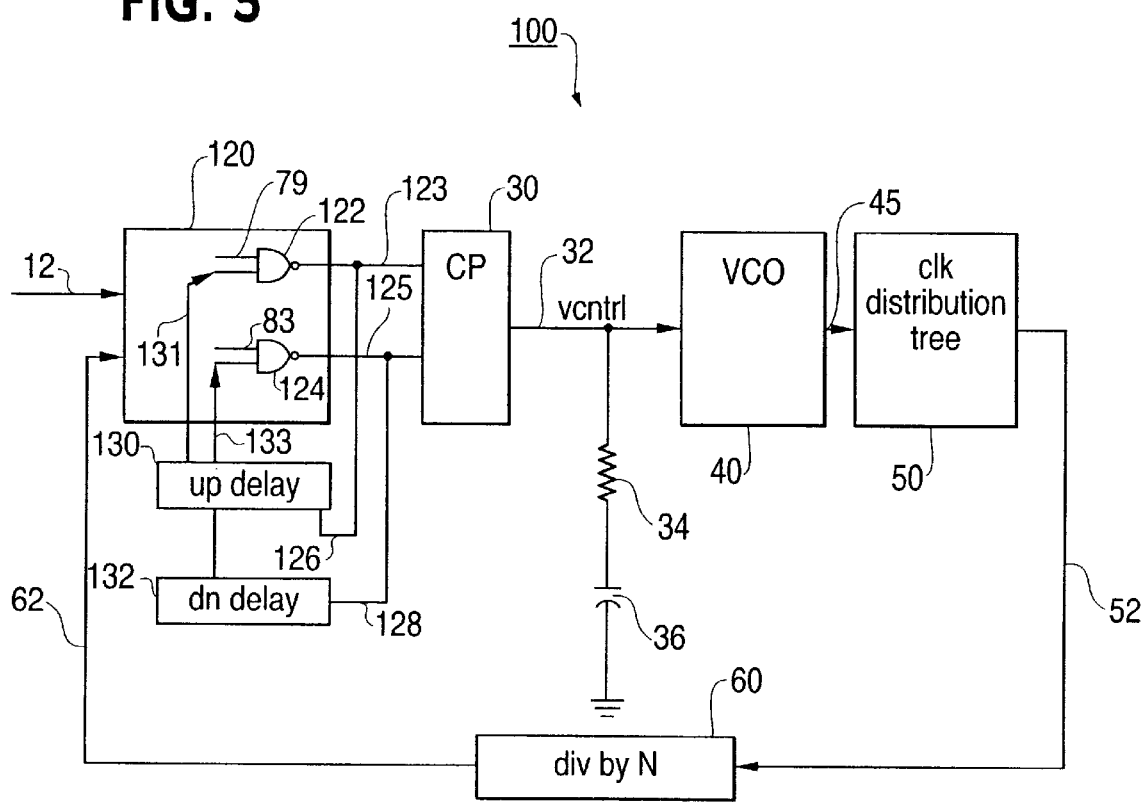
FIG. 5 shows a clocking system according to an example embodiment of the present invention.

FIG. 5 shows a clocking system 100 according to an example embodiment of the present invention. Other embodiments, configurations and connections are also within the scope of the present invention. In this example embodiment, a phase frequency detector 120 receives the reference clock signal 12 and the feedback clock signal 62. The phase frequency detector 120 may produce the signal 79 and the signal 83 in a similar manner as discussed above. The signal 79 may be applied to a first input of a NOR gate 122. A delay up signal 131, which will be described below, may be applied to a second input of the NOR gate 122. The NOR gate 122 performs a logical NOR operation on the signal 79 and the delay up signal 132 to provide an adjusted up signal 123. The signal 83 may be applied to a first input of a NOR gate 124. A delay down signal 133, which will be described below, may be applied to a second input of the NOR gate 124. The NOR gate 124 performs a logical NOR operation on the signal 83 and the delay down signal 133 to provide an adjusted down signal 125.

The adjusted up signal 123 is applied along a signal line 126 to the up delay circuit 130 that produces the delay up signal 131. The adjusted down signal 125 is applied along a signal line 128 to the delay down circuit 132 that produces the delay down signal 133. The delay up signal 131 is applied to an input of the NOR gate 122 and the delay down signal 133 is applied to an input of the NOR gate 124. The adjusted up signal 123 and the adjusted down signal 125 are obtained by the logical NOR operation of the respective NOR gates 122 and 124.

The adjusted up signal 26 and the adjusted down signal 28 indicate respective positive and negative charge directions for the charge pump 30. The charge pump 30 may convert the signals to an analog current (or signal) which is then integrated by a loop filter to generate the voltage control signal 32. The voltage control signal 32 may be applied to the VCO 40 for varying the frequency of the VCO clock signal 45 that is input to the clock distribution tree 50.

As discussed above, the clock distribution tree 50 produces a signal 52 that is applied to the divide-by-N counter 60. The signal 52 may become the clock signal for state machines on the microchip or integrated circuit.

The divide-by-N counter 60 may produce the feedback clock signal 62 that is applied to an input of the phase frequency detector 20. A filter, such as a second order filter, may also be provided between the charge pump 30 and the VCO 40. The second order filter may include the resistor 34 and the capacitor 36 coupled to ground. Other types of filters and configurations of the filter are also within the scope of the present invention.

The NOR gates 122, 124, the up delay circuit 130 and the down delay circuit 132 function together to alter the width of the previously described up and down signals. By altering (i.e., reducing or chopping) the width of the output signals from the phase frequency detector 120, the amount of charge that is added or removed by the charge pump 30 is smaller than that described above with respect to FIG. 1. This may cause the changes in the frequency of the VCO clock signal 45 to be in small increments until the final lock (i.e., synchronization) condition is achieved.

Figure 6:
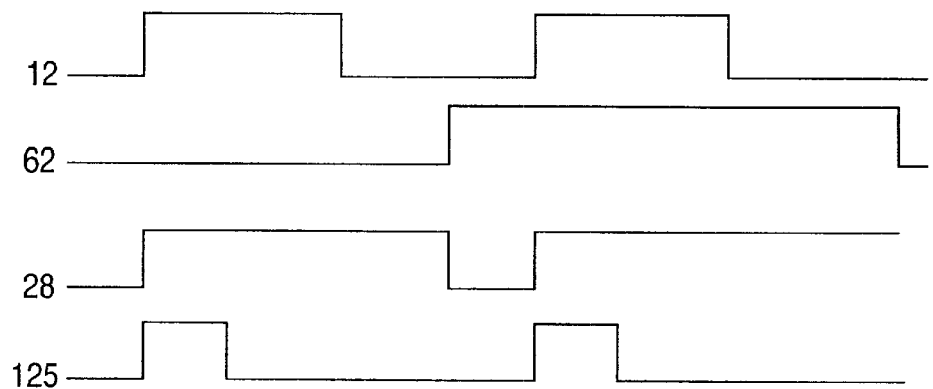
FIG. 6 is a timing diagram of signals shown in FIG. 5.

FIG. 6 shows a timing diagram of signals shown in FIG. 5 as compared with the down signal 28 from FIG. 1. These signals are one example embodiment and are not meant to limit the scope of the present invention. That is, other timings and configurations of the signals are also within the scope of the present invention. In FIG. 6, the reference clock signal 12 is shown as leading the feedback clock signal 62. The phase frequency detector 120 may produce the signal 83 in a similar manner to the FIG. 1 example. The signal 83 is applied to the first input of the NOR gate 124 which in combination with the be down delay circuit 132 produces the adjusted down signal 125. As can be seen, the width of the adjusted down signal 125 is smaller than the width of the down signal 28. The width of the adjusted down signal 125 is smaller than the width of the signal 83. This may therefore avoid the transient overshooting problems described above.

The width of the adjusted up signal 123 and the adjusted down signal 125 may be determined by the delay within the up delay circuit 130 and the down delay circuit 132. This delay may also be made programmable or different delay structures may be used such as a static delay chain of buffers or a dynamic delay chain where the delay tracks the internal bias voltage of the phase lock loop.

Figure 7:
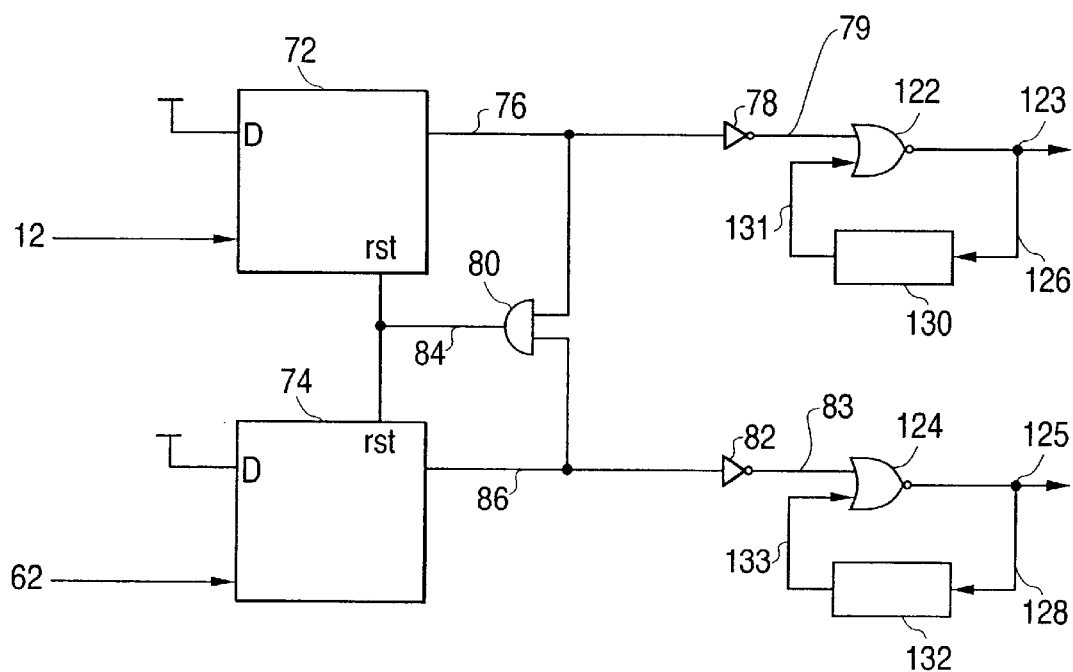
FIG. 7 shows the phase frequency detector from FIG. 4 according to an example embodiment of the present invention.

FIG. 7 shows the phase frequency detector 120 and width control circuit according to an example embodiment of the present invention. Other embodiments and configurations of the phase frequency detector 120 and width control circuit are also within the scope of the present invention. Embodiments of the present invention may be described as the width control circuit being part of the phase frequency detector 120. Other embodiments of the present invention may describe the width control circuit as being external to the phase frequency detector 120. Both embodiments and configurations are within the scope of the present invention.

FIG. 7 shows the first flip flop circuit 72 and the second flip flop circuit 74. Each of the flip flop circuits 72 and 74 may be a D-type of flip flop circuit in which the D inputs are connected to a high voltage ($V_{cc}$). The flip flop circuits 72 and 74 may be other types of flip flop circuits or may be state machines. The reference clock signal 12 may be applied to a clock input of the first flip flop circuit 72 and the feedback clock signal 62 may be applied to a clock input of the second flip flop circuit 74. The first flip flop circuit 72 may produce the signal 76 that is applied to an input of the inverter circuit 78. The inverter circuit 78 produces the signal 79 that is applied to a first input of the NOR gate 122. The delay up signal 131 may be applied to a second input of the NOR gate 122. The NOR gate 122 performs a logical NOR operation on the signal 79 and the delay up signal 131 to produce the adjusted up signal 123. The adjusted up signal 123 may be applied along the signal line 126 to the up delay circuit 130. The up delay circuit 130 produces the delay up signal 131.

The second flip flop circuit 74 may produce the signal 86 that is applied to an input of the inverter circuit 82. The inverter circuit 82 produces the signal 83 that is applied to a first input of the NOR gate 124. The delay down signal 133 may be applied to a second input of the NOR gate 124. The NOR gate 124 performs a logical NOR operation on the signal 83 and the delay down signal 133 to produce the adjusted down signal 125. The adjusted down signal 125 may be applied along the signal line 128 to the down delay circuit 132. The up delay circuit 130 produces the delay down signal 133.

The signal 76 and the signal 86 may be input to the NAND gate 80. The NAND gate 80 performs a logical NAND operation on the signal 76 and the signal 86 to produce the reset signal 84. The reset signal 84 may be applied to the reset input of the first flip flop circuit 72 and to the input of the second flip flop circuit 74.

Figure 8:
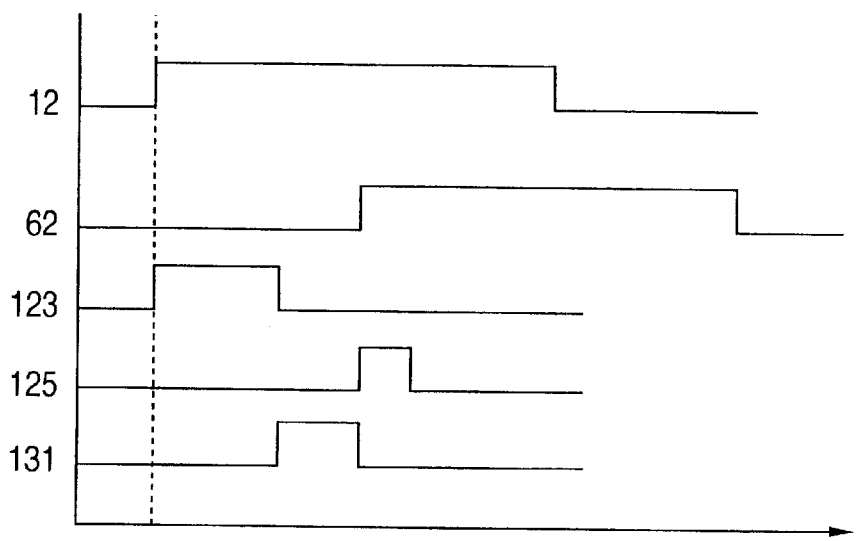
FIG. 8 is a timing diagram of signals shown in FIG. 7.

FIG. 8 shows a timing diagram of signals shown in FIG. 7. These signals are one example embodiment and are not meant to limit the scope of the present invention. That is, other configurations and timings of the signals are within the scope of the present invention.

FIG. 8 shows the reference clock signal 12 leading the feedback clock signal 62. On the leading edge of the reference clock signal 12, the adjusted up signal 123 goes high. The signal 123 may be fed back through the up delay circuit 130 to produce the delay up signal 131. The delay circuit 131 operates in conjunction with the NOR gate 122 to cause the adjusted up signal 123 to go low thereby chopping the width of the up signal as compared with the up signal from the FIG. 1 example and as compared with the signal 79. FIG. 8 also shows the adjusted down signal 125 that is produced based on the leading edge of the feedback clock signal 62.

Figure 9:
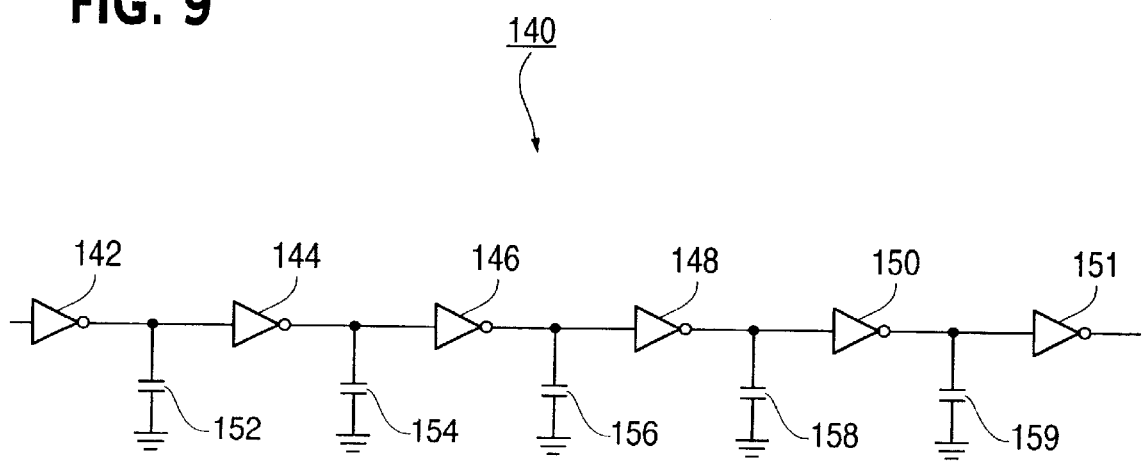
FIG. 9 shows a delay circuit according to an example embodiment of the present invention.

FIG. 9 shows a delay circuit 140 according to an example embodiment of the present invention. The delay circuit 140 may correspond to the up delay circuit 130 and/or the down delay circuit 132. Other configurations and embodiments of the delay circuit are also within the scope of the present invention.

The delay circuit 140 may be a series of inverters and capacitors coupled in a series of cascaded buffers. For example, a first inverter 142 may receive either the signal 123 or the signal 125. The first inverter 142 may be coupled to a second inverter 144 that is coupled to a third inverter 146. The third inverter 146 may be coupled to a fourth inverter 148 that is coupled to a fifth inverter 150. The fifth inverter 150 may be coupled to a sixth inverter 151. The respective capacitors 152, 154, 156, 158 and 159 may be coupled between each of the inverters and be coupled to ground as shown in FIG. 9. Stated differently, the delay circuit 140 may be achieved by a series of inverter gate delays followed by capacitors coupled to ground. Each stage may be delayed by gate delay. Each gate delay may be proportional to the capacitance of the next stage. The number of stages in the delay circuit 140 may be altered depending on the desired delay.

Figure 10:
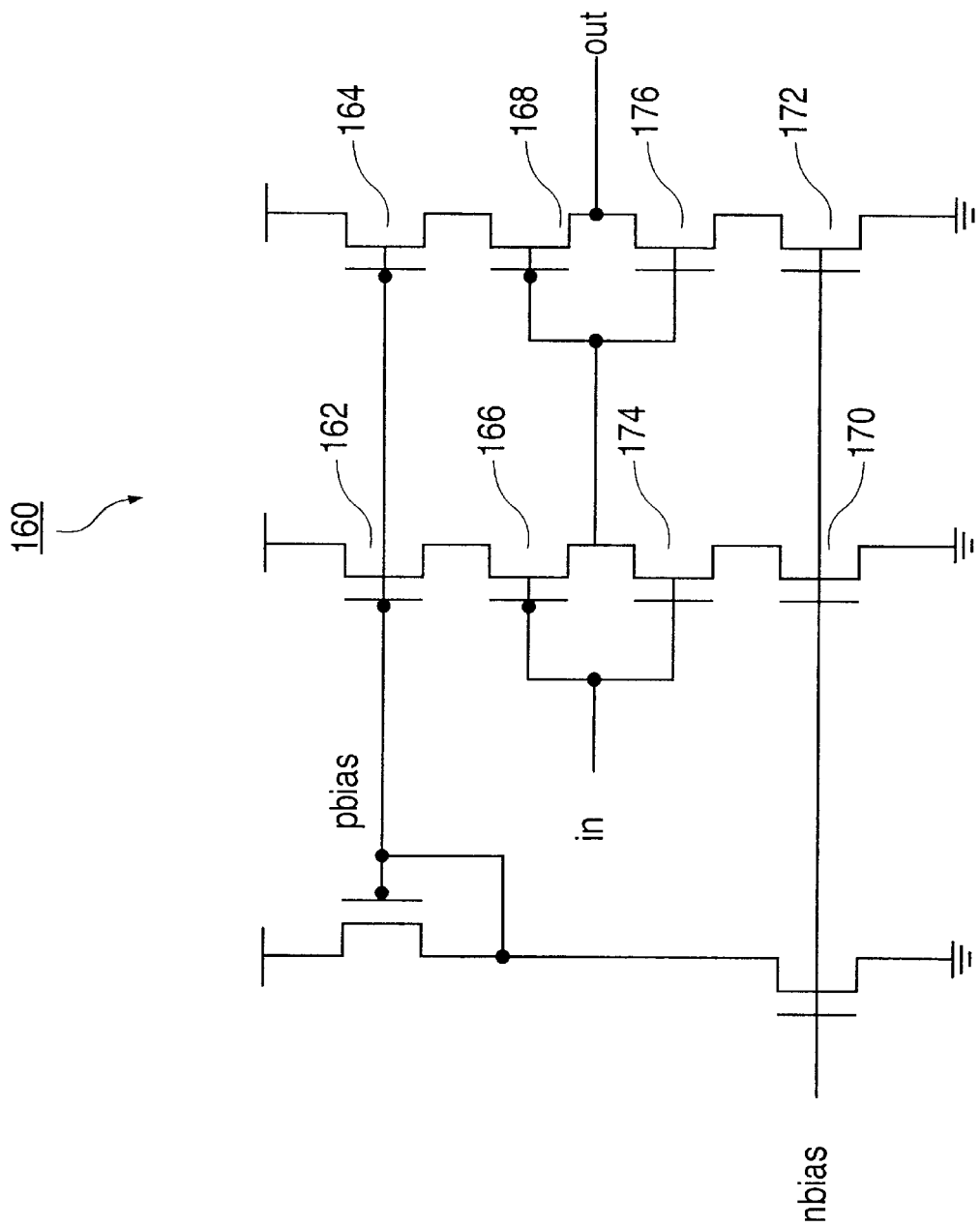
FIG. 10 shows a delay circuit according to an example embodiment of the present invention.

FIG. 10 shows a delay circuit 160 according to an example embodiment of the present invention. The delay circuit 160 may correspond to the up delay circuit 130 and/or the down delay circuit 132. Other configurations and embodiments of the delay circuit are also within the scope of the present invention.

The delay circuit 160 may be a current starved delay circuit that is coupled to the internal bias of the phase-lock loop. More specifically, the nbias may be set by the internal biasing circuits of the phase-lock loop. The pbias may be generated from the nbias. The pbias and the nbias may control the current through the p-transistors 162 and 164 and the n-transistors 170 and 172. This in turn controls the delay through the p-transistors 166 and 168 and the n-transistors 174 and 176.

Other embodiments of delay circuits are within the scope of the present invention including a programmable device that allows the user to set the delay.

Figure 11:
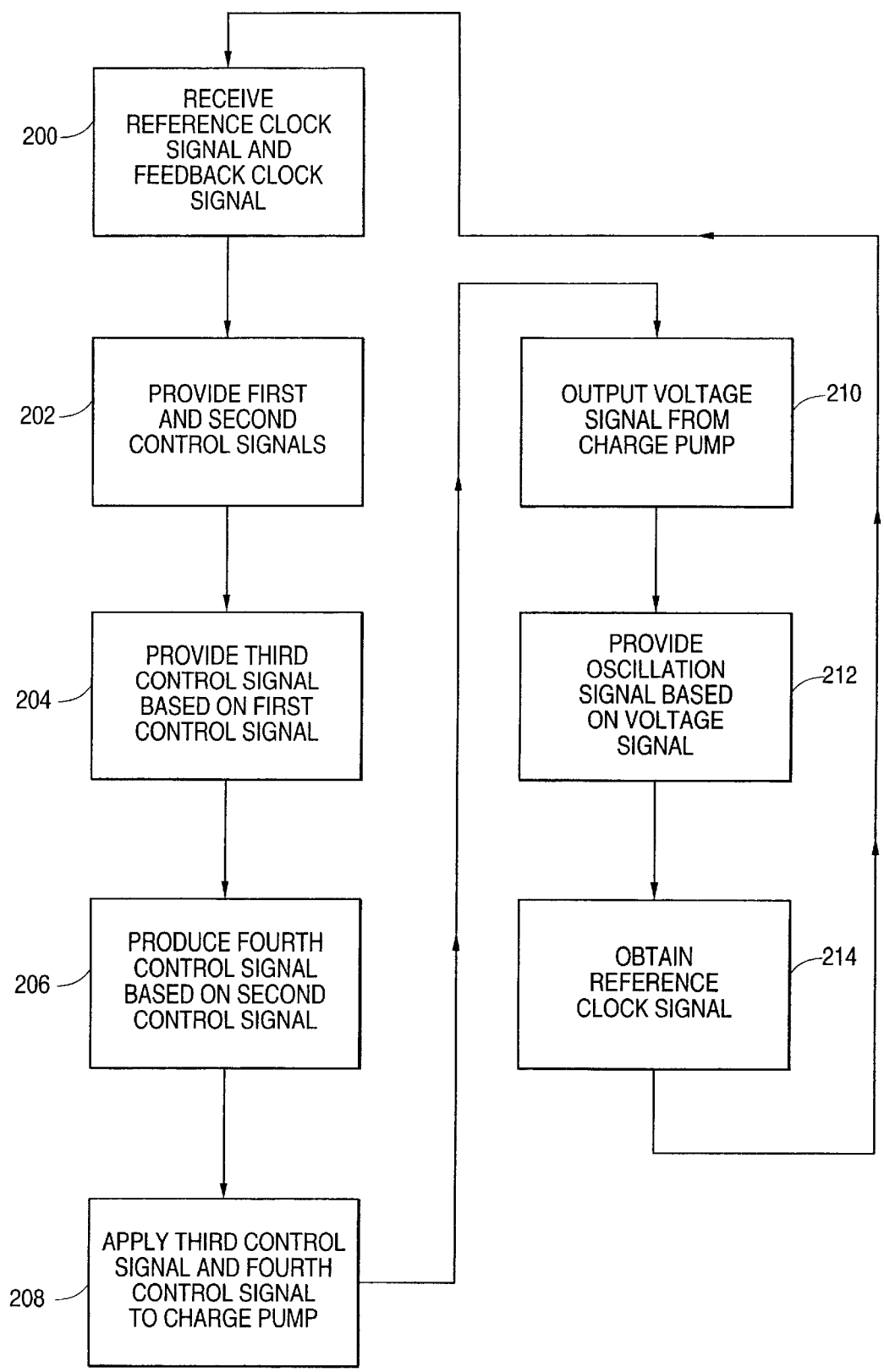
FIG. 11 is a flowchart showing an example embodiment of the present invention.

FIG. 11 shows a flowchart of one example embodiment of the present invention. Other embodiment and ordering of the blocks are also within the scope of the percent invention. As shown in FIG. 11, in block 200, the phase frequency detector 120 may receive the reference clock signal 12 and the feedback clock signal 62. In block 202, the phase frequency detector 120 may provide the first and second control signals, such as the signals 79 and 83 shown in FIG. 5. In block 204, the third control signal may be produced based on the first control signal. In other words, the phase frequency detector 120 may produce the adjusted up signal 123 based on the signal 79. In block 206, the fourth control signal may be produced based on the second control signal. That is, the phase frequency detector 120 may produce the adjusted down signal 125 based on the signal 83.

In block 208, the third and fourth control signals may be applied to the charge pump. That is, the signals 123 and 125 may be input to the charge pump 30. In block 210, the voltage signal may be output from the charge pump and the filter and the oscillation signal may be provided based on the voltage signal. For example, the voltage signal 32 may be input to the VCO 40 that provides an oscillation signal 45 based on the voltage signal 32. In block 214, the reference clock signal may be produced. For example, the reference clock signal 62 may be produced by the combination of the VCO clock signal 45, the clock distribution tree 50 and the divide-by-N counter 60. Operations may then return back to block 200 to repeat the process until synchronization occurs between the reference clock signal 12 and the feedback clock signal 62. Production of the third control signal and the fourth control signal may utilize the up delay circuit 130 and the down delay circuit 132 as shown in FIG. 5.

As can be seen by the above discussion, embodiments of the present invention may provide a width control circuit that alters the width of the signal that is applied to the charge pump. By altering the width of the up and down signals that are applied to the charge pump, problems relating to transient overshoot may be avoided. While the present invention may affect operations prior to synchronization between the reference clock signal and the feedback clock signal, the present invention may not affect operations of the phase lock loop system in its steady state condition. Stated differently, the present invention relates to the transient operation without affecting the steady state operations. Still further, after lock occurs between the reference clock signal and the feedback clock signal and if a phase error exceeds the delay, then any excess of the phase error that is larger than the delay will be ignored. As an example, if the delay is 300 ps and after lock a noise causes a sudden 500 ps of phase error, then the phase lock loop system may react only to the first 300 ps of phase error and ignore the remaining 200 ps. In this way, the delay itself may be used to minimize the impact of the phase lock loop system.

While the invention has been described with reference to specific embodiments, the description of the specific embodiments is illustrative only and is not to be construed as limiting the scope of the invention. Various other modifications and changes may occur to those skilled in the art without departing from the spirit and scope of the invention.

What is claimed is:

1. A phase lock loop system comprising a phase frequency detector device to receive a reference clock signal and a feedback clock signal and to provide a first control signal to a first input of a first circuit component and to provide a second control signal to an input of a second circuit component, an output of said first circuit component being input to a width control circuit which outputs a signal to a second input of said first circuit component, said width control circuit to alter a width of said first control signal and to produce an altered first control signal.

2. The phase lock loop system of claim 1, wherein said width control circuit further alters a width of said second control signal to produce an altered second control signal.

3. The phase lock loop system of claim 2, further comprising:
    a charge pump and filter device having a first input to receive said altered first control signal, having a second input to receive said altered second control signal, and having an output to provide a voltage signal responsive to the altered first control signal and the altered second control signal; and
    a voltage controlled oscillator having an input coupled to the output of the charge pump and filter device to provide an oscillation signal having a frequency responsive to the voltage signal.

4. The phase lock loop system of claim 2, wherein the width control circuit comprises a first delay circuit and a second delay circuit, wherein a delay of said first delay circuit determines a width of the altered first control signal and a delay of the second delay circuit determines a width of the altered second control signal.

5. The phase lock loop system of claim 4, wherein the first delay circuit comprises a plurality of cascaded buffers.

6. The phase lock loop system of claim 4, wherein the first delay circuit comprises a current starved delay circuit coupled to an internal bias of the phase lock loop system.

7. The phase lock loop system of claim 1, wherein said first circuit component comprises a first logical NOR gate and said first control signal is applied to said first input of said first logical NOR gate, said first logical NOR gate to output said altered first control signal to said width control circuit, an output of said width control circuit being applied to said second input of said first logical NOR gate.

8. The phase lock loop system of claim 2, wherein said second control signal is applied to an input of a logical NOR gate, said logical NOR gate to output said altered second control signal to said width control circuit, an output of said width control circuit being applied to another input of said logical NOR gate.

9. The phase lock loop system of claim 1, wherein said width of said first control signal is based on a difference between said reference clock signal and said feedback clock signal, said width control circuit altering said width of said first control signal to a width of said altered first control signal.

10. The phase lock loop system of claim 1, wherein a difference between the first control signal and the second control signal is indicative of a phase difference between the reference clock signal and the feedback clock signal.

11. The phase lock loop system of claim 1, wherein said width control circuit affects operation of said system prior to synchronization between said reference clock signal and said feedback clock signal without affecting normal operation of said system during steady state conditions.

12. The phase lock loop system of claim 1, wherein subsequent to synchronization between the reference clock signal and said feedback clock signal, portions of a phase error are ignored that exceed a delay of said phase lock loop system.

13. A clocking system comprising a phase frequency detector device to receive a reference clock signal and a feedback clock signal, said phase frequency detector device to provide a first signal based on the reference clock signal and the feedback signal, a width of said first signal being based on a difference between said reference clock signal and said feedback clock signal, said phase frequency detector device to alter the width of said first signal and to output a second signal, wherein said first signal is applied to a first input of a first circuit component, said first circuit component to output said second signal to a first delay circuit, an output of said first delay circuit being applied to a second input of said first circuit component.

14. The clocking system of claim 13, wherein said phase frequency detector device also provides a third signal based on the reference clock signal and the feedback clock signal, said phase frequency detector device altering a width of said third signal and outputting a fourth signal.

15. The clocking system of claim 14, further comprising:
a charge pump and filter device having a first input to receive said second signal, having a second input to receive said fourth signal, and having an output to provide a voltage signal responsive to the second signal and the fourth signal; and
a voltage controlled oscillator having an input coupled to the output of the charge pump and filter device to provide an oscillation signal having a frequency responsive to the voltage signal.

16. The clocking system of claim 14, wherein the phase frequency detector device includes a width control circuit having said first delay circuit and a second delay circuit, wherein a delay of said first delay circuit determines a width of the second signal and a delay of the second delay circuit determines a width of the fourth signal.

17. The clocking system of claim 16, wherein the first delay circuit comprises a plurality of cascaded buffers.

18. The clocking system of claim 13, wherein the first delay circuit comprises a current starved delay circuit coupled to an internal bias of the clocking system.

19. The clocking system of claim 13, wherein said first circuit component comprises a first logical NOR gate and said first signal is applied to said first input of said first logical NOR gate, said first logical NOR gate to output said second signal to said first delay circuit, an output of said first delay circuit being applied to said second input of said first logical NOR gate.

20. The clocking system of claim 14, wherein said third signal is applied to an input of a logical NOR gate, said logical NOR gate to output said fourth signal to a second delay circuit, an output of said second delay circuit being applied to another input of said logical NOR gate.

21. A method comprising;
receiving a reference clock signal and a feedback clock signal;
providing a first control signal having a width based on said reference clock signal and said feedback clock signal; and
producing a second control signal having a different width than the first control signal by applying said first control signal to an input of a first circuit component and outputting said second control signal from said first circuit component.

22. The method of claim 21, further comprising:
providing a third control signal having a width based said reference clock signal and said feedback clock signal; and
producing a fourth control signal having a different width than said third control signal.

23. The method of claim 22, further comprising;
applying said second control signal to a charge pump and filter device;
applying said fourth control signal to said charge pump and filter device; and
outputting a voltage signal from said charge pump and filter device, said voltage signal being responsive to said second control signal and said fourth control signal.

24. The method of claim 21, wherein said first circuit component comprises a first logical NOR gate and said first control signal is applied to said input of said first logical NOR gate, and said second control signal is produced by outputting said second control signal from said first logical NOR gate.

25. The method of claim 24, further comprising applying said second control signal to a first delay circuit and outputting a delay signal to another input of said first logical NOR gate.

26. The method of claim 25, wherein the first delay circuit comprises a plurality of cascaded buffers.

27. The method of claim 25, wherein the first delay circuit comprises a current starved delay circuit.

28. The method of claim 24, wherein said third control signal is applied to an input of a second logical NOR gate, and said fourth control signal is produced by outputting said fourth control signal from said second logical NOR gate.

29. The method of claim 28, further comprising applying said fourth control signal to a second delay circuit and outputting a delay signal to another input of said second logical NOR gate.

30. A phase lock loop system comprising a phase frequency detector device to receive a reference clock signal and a feedback clock signal and to provide a first control signal and a second control signal, said phase lock loop system including a width control circuit to alter a width of said first control signal and to produce an altered first control signal, wherein the width control circuit comprises a first delay circuit and a second delay circuit, said first delay circuit comprises a current starved delay circuit coupled to an internal bias of the phase lock loop system, wherein a delay of said first delay circuit determines a width of the altered first control signal and a delay of the second delay circuit determines a width of the altered second control signal.

31. A phase lock loop system comprising a phase frequency detector device to receive a reference clock signal and a feedback clock signal and to provide a first control signal and a second control signal, said phase lock loop system including a width control circuit to alter a width of said first control signal and to produce an altered first control signal, wherein subsequent to synchronization between the reference clock signal and said feedback clock signal, portions of a phase error are ignored that exceed a delay of said phase lock loop system.

32. A clocking system comprising a phase frequency detector device to receive a reference clock signal and a feedback clock signal, said phase frequency detector device to provide a first signal based on the reference clock signal and the feedback signal, a width of said first signal being based on a difference between said reference clock signal and said feedback clock signal, said phase frequency detector device to alter the width of said first signal using a delay circuit and to output a second signal, wherein the delay circuit comprises a current starved delay circuit coupled to an internal bias of the clocking system.

33. A method comprising:

receiving a reference clock signal and a feedback clock signal;

providing a first control signal having a width based on said reference clock signal and said feedback clock signal;

producing a second control signal having a different width than the first control signal; and applying said second control signal to a delay circuit, wherein said delay circuit comprises a current starved delay circuit.

* * * * *